(12) United States Patent
Meeuwsen et al.

(10) Patent No.: US 6,608,351 B1
(45) Date of Patent: Aug. 19, 2003

(54) SEMICONDUCTOR DEVICE COMPRISING A HIGH-VOLTAGE CIRCUIT ELEMENT

(76) Inventors: Constantinus Paulus Meeuwsen, Gerstweg 2, 6534 AE Nijmegen (NL); Hendrik Gezienus Albert Huizing, Prof. Holstlaan 6, 5656 AA Eindhoven (NL); Adrianus Willem Ludikhuize, Prof. Holstlaan 6, 5656 AA Eindhoven (NL)

(*) Notice: Subject to any disclaimer, the term of this patent is extended or adjusted under 35 U.S.C. 154(b) by 55 days.

(21) Appl. No.: 09/585,824

(22) Filed: Jun. 1, 2000

(30) Foreign Application Priority Data

Jun. 3, 1999 (EP) ............................................. 99201760

(51) Int. Cl.⁷ ............................ H01L 29/76; H01L 23/58
(52) U.S. Cl. ..................... 257/343; 257/488; 257/489; 257/492; 257/493; 257/640; 257/646; 257/649
(58) Field of Search ................................. 257/630, 640, 257/646, 649, 343, 487, 488, 489, 492, 493

(56) References Cited

U.S. PATENT DOCUMENTS 4,947,232 A * 8/1990 Ashida et al. .............. 257/488
5,107,323 A   4/1992 Knolle et al. ................ 357/54

FOREIGN PATENT DOCUMENTS

| EP | 0182422 A2 | 5/1986 | ................ 257/487 |
| EP | 0615291 A1 | 9/1994 | ................ 257/487 |

\* cited by examiner

*Primary Examiner*—Steven Loke

(57) ABSTRACT

The performance of high-voltage devices is often influenced by charge-creep effects in the package. In order to avoid the resultant degradation, a bleeder may be used between the device and the package. However, it has been found in practice that the use of a high-resistive bleeder may lead to a certain instability of the device during operation. According to the invention, the bleeder (8) is provided with a plurality of conductive regions (12, 13) which are distributed in such a way that, when a high voltage is applied across the bleeder, a non-linear potential profile across the bleeder is obtained, which harmonizes with the ideal potential profile without the bleeder, instead of a linear profile which would have been obtained in the absence of said conductive regions due to charge-loading effects, and which would result in the above-mentioned instability effects.

8 Claims, 2 Drawing Sheets

SEMICONDUCTOR DEVICE COMPRISING A HIGH-VOLTAGE CIRCUIT ELEMENT

BACKGROUND OF THE INVENTION

The invention relates to a semiconductor device having a semiconductor body comprising a high-voltage circuit element having a surface region adjacent to a surface of the semiconductor body, which surface region is covered with an electrically insulating layer and in which two zones are formed at some distance from each other, between which a high voltage can be applied, during operation, and a part of the insulating layer, situated above a part of the substantially single-conductivity type surface region situated between the two zones, is provided with a semi-insulating layer provided with two connections by means of which a high voltage can also be applied across the semi-insulating layer. Such a device is known from, inter alia, the patent document U.S. Pat. No. 5,107,323.

The high-voltage circuit element may be, for example, a diode or a junction field-effect transistor (JFET) or a lateral field-effect transistor of the DMOST type.

If no additional measures are taken, such high-voltage devices often are adversely affected by charge-creep effects via the synthetic resin envelope during high-voltage operation, particularly at a comparatively high temperature. At said high voltage, electric-charge transport takes place, for example transport of ions in the envelope, causing the voltage distribution to be changed. This will influence the properties and the quality of the device if a protective screen is not provided. For example, the breakdown voltage may be reduced and/or the on-resistance increased, i.e. the device is not stable.

The influence of charge creep in the synthetic resin can be limited by providing a resistive layer or a semi-insulating layer on the device, as described in the patent document U.S. Pat. No. 5,107,323, as a result of which a certain voltage distribution is impressed upon the device. In practice it has been found, however, that also in this case instability often occurs, as a result of which the on-resistance is increased and/or the breakdown voltage reduced with the lapse of time.

SUMMARY OF THE INVENTION

It is an object of the invention to provide, inter alia, a high-voltage semiconductor device which remains stable after having been in operation for a prolonged period of time. The invention further aims at providing such a device, which can be manufactured using customary processes and without introducing additional process steps.

To achieve this, a semiconductor device of the type described in the opening paragraph is characterized in accordance with the invention in that electroconductive regions are provided between the two connections of the semi-insulating layer, the distribution of said electroconductive regions being such that a non-linear potential distribution is obtained in the semi-insulating layer.

The invention is based, inter alia, on the recognition that if a voltage is applied across the resistive layer for a certain period of time, the semi-insulating layer will eventually impress a linear potential gradient upon the device. The rate at which this takes place depends upon the resistivity. However, such a linear potential gradient does not have to correspond to the potential gradient at the surface of the semiconductor body, which is often not linear. When the high voltage across the resistive layer disappears, the electric charge in the resistive layer will not disappear immediately, so that it will continue to exert influence for some time. This may lead to an increase of the on-resistance of the circuit element. By providing the resistive layer with a non-linear distribution of conductive regions, it becomes possible to obtain a non-linear potential gradient in the resistive layer, which non-linear potential gradient is adapted to the potential gradient at the surface of the semiconductor body, so that the above-mentioned instability is avoided.

An embodiment of a device in accordance with the invention is characterized in that the zones are provided with contacts which have been formed jointly with the conductive regions from a common conductive metal layer. As the conductive regions and the metal contacts of the zones can be simultaneously formed, additional process steps to provide the conductive regions are avoided.

A favorable embodiment of a device in accordance with the invention, wherein the semi-insulating layer is formed during the provision of a passivating layer, is characterized in that the semi-insulating layer is formed by a passivating layer enriched by silicon which is applied to the electrically insulating layer and the conductive regions. The resistance of the semi-insulating layer can be advantageously adjusted by means of the quantity of silicon by which the passivating layer is enriched. For the passivating layer use can be made, for example, of silicon nitride, which is a customary material in the semiconductor technology.

The invention can be advantageously used in the manufacture of various high-voltage structures. A semiconductor device in accordance with the invention, wherein particular advantages are achieved is characterized in that said zones form a source zone and, separated therefrom by an intermediate channel region, a drain zone of a field effect transistor, the connections of the semi-insulating layer being connected to the source zone and the drain zone. The transistor may be, for example, a JFET, a lateral MOS transistor, a lateral DMOS transistor or a lateral IGBT (lateral Isolated Gated Bipolar Transistor).

An important preferred embodiment of a semiconductor device in accordance with the invention is characterized in that the circuit element is of the RESURF type. As is well known, in a RESURF device, a high breakdown voltage is obtained by a reduction of the electric fields at the surface of the semiconductor body. To achieve this, the device is embodied such that the layer wherein these fields develop is depleted across its entire thickness before breakdown has occurred. Theoretical examinations have shown that, for this purpose, the layer must satisfy the condition that the product of the doping concentration N and the thickness of the layer is approximately equal to $10^{12}$ atoms per $cm^2$. By applying the RESURF principle in a device in accordance with the invention, inter alia, the advantage is obtained that in the event of a very rapid voltage increase, breakdown is avoided even if the semi-insulating layer has not yet been able to exert influence.

These and other aspects of the invention will be apparent from and elucidated with reference to the embodiments described hereinafter.

DESCRIPTION OF THE PREFERRED EMBODIMENTS

Figure 1:
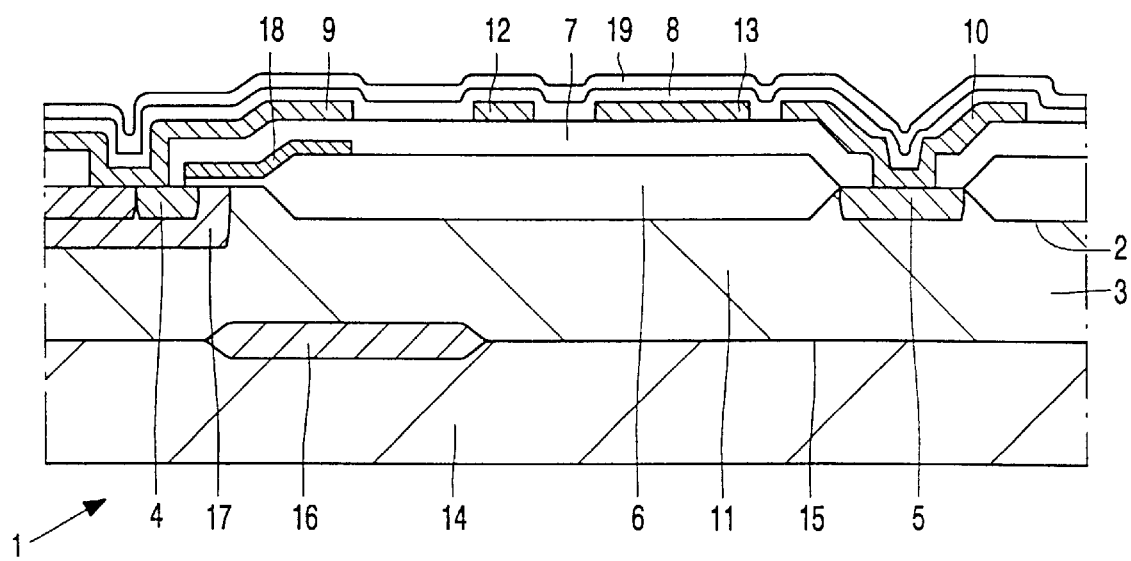
FIG. 1 is a sectional view of a first semiconductor device in accordance with the invention.

In the following, the invention will be described by means of a high-voltage field effect transistor of the lateral DMOS type, often referred to as LDMOST. A sectional view of the transistor is shown in FIG. 1; it is to be noted that in the drawing only a single transistor is shown, but it will be absolutely clear to a person skilled in the art that this transistor can also be part of an integrated circuit jointly with other circuit elements formed in a common semiconductor body.

The device comprises a semiconductor body 1 which, in this example, is made from silicon but which may alternatively be made from another suitable semiconductor material, such as SiC. Adjacent to the surface 2, the body 1 comprises a surface layer 3 wherein two surface zones 4 and 5 are formed at some distance from each other, between which a high voltage, for example several hundred volts, can be applied during operation. In order to reduce the effects of charge-creep in the customary epoxy resin of the envelope on the properties of the transistor, a highly resistive layer or semi-insulating layer 8 is provided between the surface zones 4 and 5, above a part 11 of the surface region 3, which is predominantly of a certain conductivity type, and which is covered with an electrically insulating layer 6, 7. In this example, the region 11 is entirely of the n-type and forms the drift region of the transistor. On either side of the resistive layer 8, there are two electric connections 9 and 10 by means of which a potential difference can be applied across the layer 8.

In this example, the semiconductor body comprises a comparatively lightly doped p-type substrate 14 and, on the substrate 14, an n-type epitaxial layer which forms the surface region 3. The thickness of the epi layer is, for example, approximately 7 $\mu$m. The layer 3 may be doped during the epi growth or after the epi growth by means of implantation. For the implant dose, a value is selected in the range between $10^{12}$ atoms per cm$^2$ and $2 \times 10^{12}$ atoms per cm$^2$. The layer 3 thus satisfies the condition for the RESURF effect, which means that the layer 3 can be depleted, for example, from the pn-junction 15 between the layer 3 and the substrate 14, throughout its thickness, without breakdown. As a result, any peaks in the electric field strength at the surface are reduced to such an extent that electric breakdown can only occur at very high voltages. To enhance the RESURF effect, a buried p-type layer 16 having a doping of $0.6 \times 10^{12}$ atoms per cm$^2$ is locally provided between the epi layer 3 and the substrate 14. The transistor comprises a p-type back gate region 17, which is formed in the layer 3 and wherein the n-type source, formed by the zone 4, is provided. The drain of the transistor is formed by the n-type zone 5 which is separated from the zones 4, 17 by the intermediate, relatively lightly doped drift region 11. The connection 9 of the resistive layer 8 is formed by the source contact which, as shown in the drawing, is also connected to the back gate region 17 via a highly doped p-type contact zone. The drain contact is formed by the other connection 10 of the resistive layer 8.

The transistor comprises a gate 18 of polycrystalline silicon, which is separated from the channel in the back gate region by thin gate oxide, and which extends beyond the channel and over a part of the thick oxide 6. In this example, the oxide layer 6 is obtained by a LOCOS process. The dielectric layer 7 extending over the gate 18 is formed by an oxide layer obtained by deposition. Contact windows are formed in the oxide layer 7, via which contact windows the metal connections 9 and 10 contact, respectively, the zones 4, 17 and 5.

In accordance with the invention, a number, in this example two, electroconductive regions 12 and 13 are provided between the connections 9 and 10, and are distributed in such a manner that, when a voltage is applied between the connections 9 and 10 for a sufficiently long period of time, a non-linear potential distribution is obtained in the resistive layer 8 in a stationary state. The conductive regions or field plates 12 and 13 can be formed at the same time as the connections 9 and 10 and hence do not require additional process steps. The semi-insulating resistive layer 8 is provided as a passivating silicon-nitride layer, which is enriched by silicon to obtain some electric conduction in the layer. The thickness of the layer is, for example, 800 nm. A second sub-layer of the passivating layer, in the form of a nonconducting silicon-nitride layer 19, is provided on the layer 8.

Figure 2:
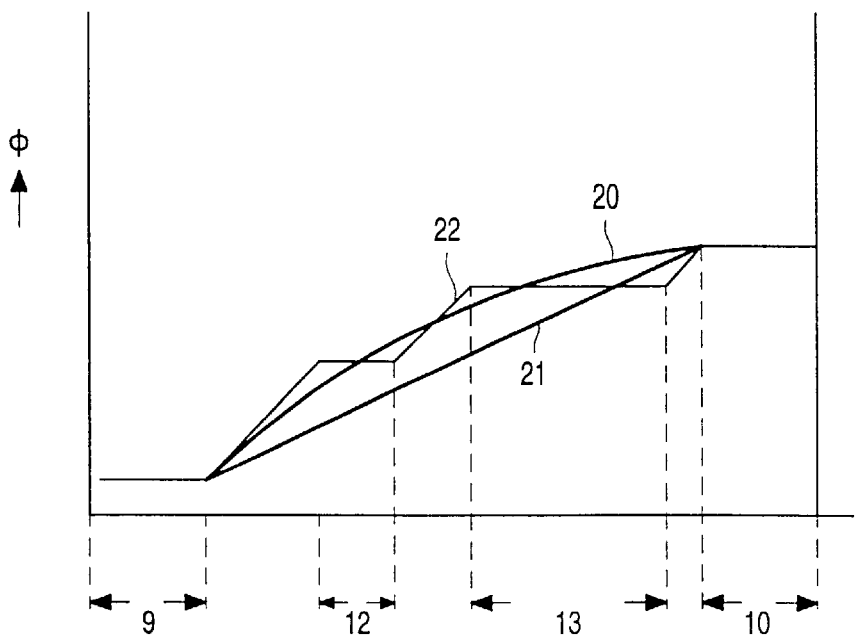
FIG. 2 graphically shows potential distributions which occur in the resistive layer during operation of the device shown in FIG. 1.

The effect of the field plates 12, 13 in combination with the resistive layer 8 is described with reference to FIG. 2 wherein the potential distribution in the resistive layer is shown for the device in accordance with FIG. 1 with and without field plates 12 and 13. The position between the connection terminals 9 and 10 is plotted on the horizontal axis, the potential $\Phi$ in the resistive layer 8 is plotted on the vertical axis. The drawing also shows the position of the contacts 9 and 10 and of the field plates 12 and 13. The overall potential jump $\Delta\Phi$ is equal to the voltage between the connection terminals 9 and 10 which may be, for example, several hundred volts. Line 20 shows the potential distribution in the resistive layer without field plates at the instant t=0 when a voltage is applied between the terminals 9 and 10. The potential distribution is not linear, but, as shown in the drawing, becomes gradually less steep in the direction from the source to the drain. This is the ideal potential distribution for reducing electric field strengths in the drift region 11. The potential distribution in the layer 8 changes with time as a result of charging effects, so that a practically linear potential gradient in the resistive layer 8 is obtained, which is represented by line 21 in FIG. 2. As a result of this potential distribution, the electric field strength may demonstrate a substantial local increase at the surface in the drift region, causing a substantial reduction of the breakdown voltage and hence the. maximum permissible voltage which can be applied to the drain during operation. In addition, charging effects often have an unfavorable influence on the on-resistance of the transistor. The potential distribution 22 is obtained by the presence of the field plates 12 and 13. As a result of the non-linear distribution of the field plates, a potential distribution is obtained which is closer to the ideal distribution, represented by line 20, than the potential distribution 21. In particular, the potential distribution can be adjusted by means of the plates 12 and 13 in such a manner that, as shown in FIG. 2, the potential drop on the source side is larger than on the drain side of the resistive layer 8.

Figure 3:
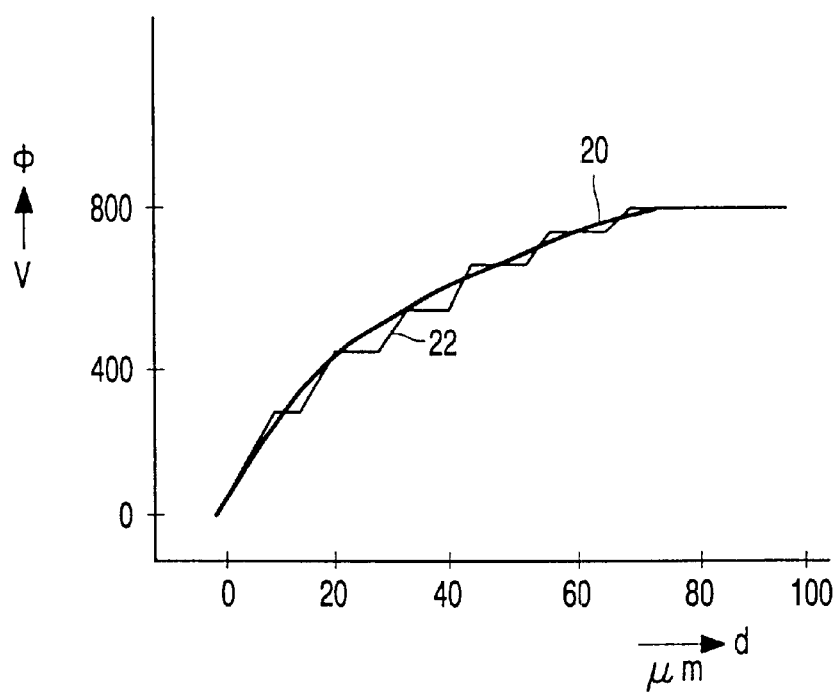
FIG. 3 shows a potential distribution in the case of a different field plate distribution in the device shown in FIG. 1.

For the sake of simplicity, FIG. 1 shows an embodiment comprising only two conductive regions or field plates 12 and 13. However, it will be clear that the ideal potential distribution in the resistive layer 8 can be approached more closely by increasing the number of field plates and hence reducing the steps in the potential distribution in the layer 8. FIG. 3 shows the potential distribution in a resistive layer 8 having a length of approximately 100 μm at a voltage of 800 V. The drawing shows that the ideal distribution can be practically approached by means of five field plates (in the drawing, the horizontal parts of curve 22).

Figure 4:
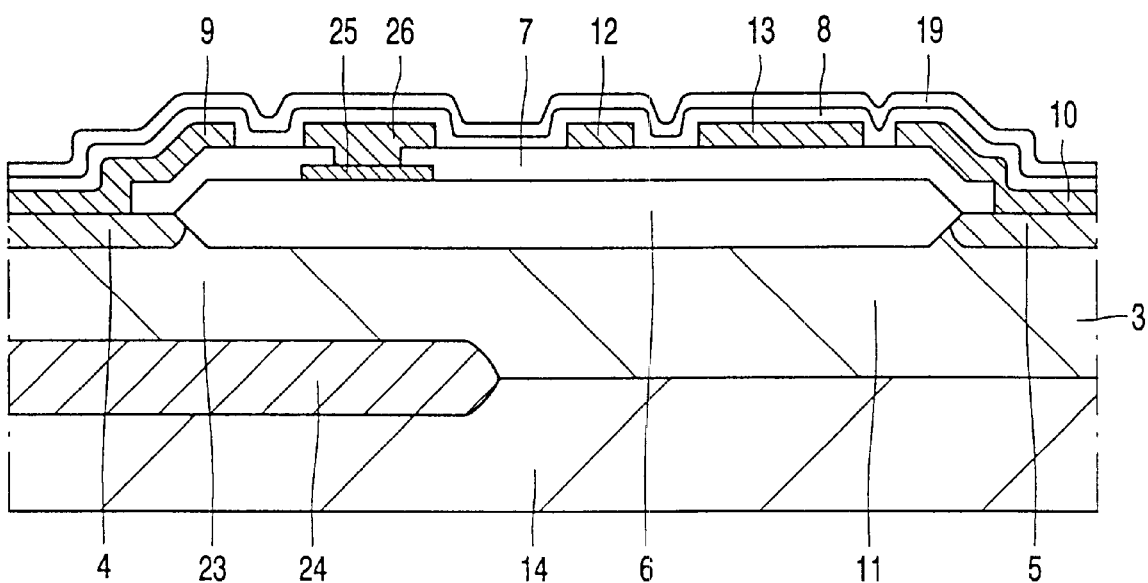
FIG. 4 is a sectional view of a second embodiment of a semiconductor device in accordance with the invention.

The invention cannot only be used to advantage in transistors of the LDMOST type, but also in other types of transistors, such as junction field-effect transistors (JFETs) or depletion field-effect transistors (deep depletion MOST). By way of illustration, FIG. 4 shows a sectional view of a transistor in accordance with the invention, which can be operated as a JFET and a deep depletion MOST or as a combination of both types. For the sake of convenience, corresponding parts bear the same reference numerals as in FIG. 1. Also in this case, the transistor comprises a p-type substrate 14 on which an n-type epitaxial layer 3 is provided. Also in this case, the thickness and the doping of the epi layer 3 are chosen so as to correspond to the RESURF conditions. In the epitaxial layer 3, the source zone 4 and the drain zone 5 are formed as highly doped n-type surface zones. The channel of the transistor is formed by a part 23 of the epitaxial layer 3 which is adjacent to the source 4, which part 23 is separated from the drain by the part 11 of the epitaxial layer which forms the drift region of the transistor. The gate of the JFET is formed by a buried p-type zone 24 with a higher doping concentration than the relatively lightly doped p-type substrate 14. The transistor can also be controlled by means of MOS action, using an insulated gate 25 which is provided, in the form of a doped poly layer, on the relatively thick field oxide 6. The gate 25 is provided with a metal contact 26 which is connected to the gate via a contact window in the TEOS layer 7. In addition to the metal contacts 9, 26 and 10, the field plates 12 and 13 are provided, at the same time as the contacts, on the TEOS layer 7, analogous to the example in accordance with FIG. 1. Also in this case, the whole is covered with a passivating silicon nitride layer comprising a silicon-enriched sub-layer 8, which is semi-insulating and forms a resistive layer, and with an electrically insulating layer 19. On the right-hand side, the resistive layer 8 is connected to the drain contact 10; on the left-hand side, the layer 8 is not connected to the source connection 9, as in the previous example, but to the gate contact 26. Of course, the layer 8 may also be connected to the source contact instead of the gate contact. The layer 8 enables the influence of charge creep in the synthetic resin envelope on the properties of the transistor to be reduced. The field plates 12 and 13 again enable a non-linear potential distribution, which is adapted to the potential distribution in the drift region 11, to be obtained, analogous to the example shown in FIG. 1.

It will be clear that the invention is not limited to the above examples, and that, within the scope of the invention, many variations are possible to those skilled in the art. For example, in the example shown in FIG. 4, more than two field plates can be provided to approach the ideal potential distribution more closely and hence improve the properties of the transistor. Instead of a silicon-enriched silicon nitride layer 8, use can +be made of other layers having a low conduction, such as oxygen-doped polycrystalline silicon. The invention can also advantageously be used in circuit elements other than those described herein, such as high-voltage diodes or transistors of the IGBT type (Insulated Gated Bipolar Transistor).

What is claimed is:

1. A semiconductor device having a semiconductor body comprising a high-voltage circuit element having a surface region adjacent to a surface of the semiconductor body, which surface region is covered with an electrically insulating layer and in which two zones are formed at some distance from each other, between which a high voltage can be applied, during operation, and a part of the insulating layer, situated above a part of the substantially single-conductivity type surface region situated between the two zones, is provided with a semi-insulating layer provided with two connections by means of which a high voltage can also be applied across the semi-insulating layer, characterized in that electroconductive regions are provided between the two connections of the semi-insulating layer, the distribution of said electroconductive regions being such that a non-linear potential distribution is obtained in the semi-insulating layer, wherein said zones form a source zone and, separated therefrom by an intermediate channel region, a drain zone of a field effect transistor, the connections of the semi-insulating layer being connected to the source zone and the drain zone.

2. A semiconductor device as claimed in claim 1, characterized in that the zones are provided with contacts which have been formed jointly with the electroconductive regions from a common conductive metal layer.

3. A semiconductor device as claimed in claim 2, characterized in that the semi-insulating layer is formed by a passivating layer enriched by silicon which is applied to the electrically insulating layer and formed on the electroconductive regions.

4. A semiconductor device as claimed in claim 3, characterized in that the passivating layer comprises a silicon-enriched silicon nitride layer.

5. A semiconductor device as claimed in claim 4, characterized in that the insulating layer comprises the silicon-enriched silicon nitride layer and a second silicon nitride layer which is not enriched by silicon.

6. A semiconductor device as claimed in claim 1, characterized in that the transistor is a DMOST-type or JFET-type transistor, the semi-insulating layer being situated above a drift region of the transistor which is located between the drain zone and the channel region of the transistor.

7. A semiconductor device as claimed in claim 1 characterized in that the distribution of the electroconductive regions is such that the potential drop in the semi-insulating layer is greater on the side of the source zone than on the side of the drain zone.

8. A semiconductor device as claimed in claim 1, characterized in that the circuit element is of the RESURF type.

* * * * *

UNITED STATES PATENT AND TRADEMARK OFFICE
CERTIFICATE OF CORRECTION

PATENT NO.     : 6,608,351 B1
DATED          : August 19, 2003
INVENTOR(S)    : Constantinus Paulus Meeuwsen et al.

It is certified that error appears in the above-identified patent and that said Letters Patent is hereby corrected as shown below:

<u>Title page,</u>
Item [73], insert -- [73] Assignee: Koninklijke Philips Electronics N.V., Eindhoven (NL) --.

Signed and Sealed this

Twentieth Day of January, 2004

JON W. DUDAS
*Acting Director of the United States Patent and Trademark Office*